United States Patent
Kim et al.

(10) Patent No.: US 10,304,784 B2
(45) Date of Patent: May 28, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Jong Man Kim, Suwon-si (KR); Han Kim, Suwon-si (KR); Kyung Ho Lee, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/938,181

(22) Filed: Mar. 28, 2018

(65) Prior Publication Data
US 2019/0096825 A1    Mar. 28, 2019

(30) Foreign Application Priority Data
Sep. 27, 2017    (KR) .................. 10-2017-0125285

(51) Int. Cl.
*H01L 23/00*    (2006.01)
*H01L 23/31*    (2006.01)
(Continued)

(52) U.S. Cl.
CPC ........ *H01L 23/562* (2013.01); *H01L 23/3121* (2013.01); *H01L 23/5383* (2013.01); *H01L 23/5384* (2013.01); *H01L 25/0655* (2013.01)

(58) Field of Classification Search
CPC .............. H01L 23/562; H01L 23/5383; H01L 23/5384; H01L 23/3121; H01L 25/0655
(Continued)

(56) References Cited

U.S. PATENT DOCUMENTS 9,607,967 B1 * 3/2017 Shih .................... H01L 25/0657
9,613,931 B2    4/2017 Lin
(Continued)

FOREIGN PATENT DOCUMENTS

KR    10-2016-0129687 A    11/2016
TW        201526123 A        7/2015
(Continued)

OTHER PUBLICATIONS

Office Action issued in Taiwanese Patent Application No. 107109375 dated Nov. 7, 2018, with English translation.

*Primary Examiner* — Dao H Nguyen
(74) *Attorney, Agent, or Firm* — Morgan Lewis & Bockius LLP

(57) ABSTRACT

A fan-out semiconductor package includes a wiring portion, semiconductor chips, a dummy chip, and an encapsulant. The wiring portion includes an insulating layer, conductive patterns formed on the insulating layer, and conductive vias penetrating through the insulating layer and connected to the conductive patterns. The semiconductor chips are disposed on one region of the wiring portion, and the dummy chip is disposed on another region thereof and has a thickness smaller than those of the semiconductor chips. The encapsulant encapsulates at least portions of the semiconductor chips and the dummy chip. An upper surface of the wiring portion is disposed below a center line of the fan-out semiconductor package, and the thickness t of the dummy chip is such that $T/2 \leq t \leq 3T/2$ in which T is a distance from the upper surface of the wiring portion to the center line of the fan-out semiconductor package.

20 Claims, 11 Drawing Sheets

(51) Int. Cl.
*H01L 23/495* (2006.01)
*H01L 25/065* (2006.01)
*H01L 21/48* (2006.01)
*H01L 23/538* (2006.01)

(58) Field of Classification Search
USPC ............... 257/668, 690, 691, 737, 738, 778,
257/E23.011, E23.019, E23.079, E23.102,
257/E23.116, E23.141, E21.507, E21.575;
438/107, 108, 122, 127, 15, 51
See application file for complete search history.

(56) References Cited

U.S. PATENT DOCUMENTS

| | | |
|---|---|---|
| 2011/0215470 A1 | 9/2011 | Chen |
| 2013/0187292 A1 | 7/2013 | Semmelmeyer |
| 2014/0103527 A1 | 4/2014 | Marimuthu |
| 2016/0322330 A1 | 11/2016 | Lin et al. |
| 2016/0358865 A1 | 12/2016 | Shih |
| 2016/0365334 A1 | 12/2016 | Shih |
| 2017/0018510 A1 | 1/2017 | Shen |
| 2017/0032980 A1* | 2/2017 | Hwang .................. H01L 24/96 |
| 2017/0125376 A1* | 5/2017 | Yeh ........................ H01L 25/50 |
| 2018/0082987 A1* | 3/2018 | Chen ................ H01L 23/49816 |
| 2018/0174865 A1* | 6/2018 | Yu .......................... H01L 24/19 |

FOREIGN PATENT DOCUMENTS

| | | |
|---|---|---|
| TW | 201639106 A | 11/2016 |
| TW | 201643966 A | 12/2016 |
| TW | 201643971 A | 12/2016 |

\* cited by examiner

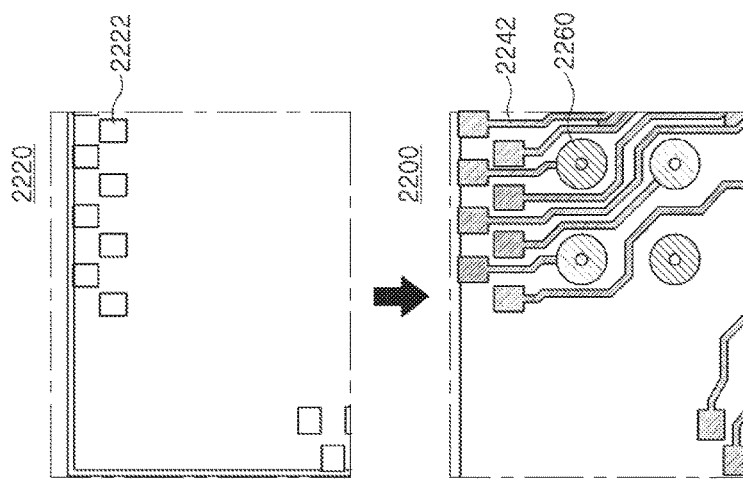
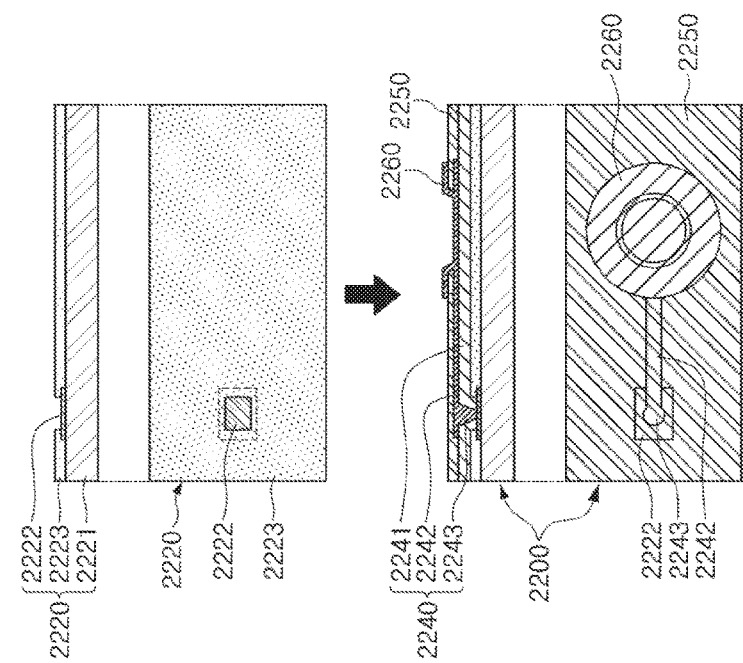
FIG.3B
FIG.3A

FAN-OUT SEMICONDUCTOR PACKAGE

CROSS-REFERENCE TO RELATED APPLICATION(S)

This application claims benefit of priority to Korean Patent Application No. 10-2017-0125285 filed on Sep. 27, 2017 in the Korean Intellectual Property Office, the disclosure of which is incorporated herein by reference in its entirety.

BACKGROUND

1. Field

The present disclosure relates to a semiconductor package, and more particularly, to a fan-out semiconductor package in which electrical connection structures may extend outwardly of regions in which semiconductor chips are disposed.

2. Description of Related Art

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded.

One type of semiconductor package technology suggested to satisfy the technical demand, described above, is a fan-out semiconductor package. Such a fan-out package has a compact size and may allow a plurality of pins to be implemented by redistributing connection terminals outwardly of a region in which a semiconductor chip is disposed.

In such a semiconductor package, when semiconductor chips, conductive patterns, an encapsulant, and the like are formed of different materials, a warpage problem may occur resulting in the package being bent upwardly or downwardly according to a change in temperature.

SUMMARY

An aspect of the present disclosure may provide a fan-out semiconductor package in which heat radiation characteristics are excellent and room temperature warpage may be effectively controlled.

According to an aspect of the present disclosure, a fan-out semiconductor package may include a wiring portion, semiconductor chips, at least one dummy chip, and an encapsulant. The wiring portion includes an insulating layer, conductive patterns formed on the insulating layer, and conductive vias penetrating through the insulating layer and connected to the conductive patterns. The semiconductor chips are disposed on one region of the wiring portion, and the at least one dummy chip is disposed on another region of the wiring portion and has a thickness smaller than those of the semiconductor chips. The encapsulant is disposed on the wiring portion and encapsulates at least portions of the semiconductor chips and the at least one dummy chip. An upper surface of the wiring portion is disposed below a center line of the fan-out semiconductor package, and the thickness t of the at least one dummy chip is such that $T/2 \leq t \leq 3T/2$ in which T is a distance from the upper surface of the wiring portion to the center line of the fan-out semiconductor package.

One surface of each of the semiconductor chips may be exposed from the encapsulant.

The semiconductor chips may each include an active surface on which connection pads are disposed and an inactive surface opposite to the active surface, and the inactive surfaces may be exposed from the encapsulant.

A plurality of semiconductor chips may be provided, and one surface of each of the plurality of semiconductor chips may be exposed from the encapsulant.

Each of the at least one dummy chip may be disposed between semiconductor chips of the plurality of semiconductor chips.

A plurality of dummy chips may be provided. The thickness of each of the plurality of dummy chips may be the same as T.

The at least one dummy chip may include the same semiconductor material as the semiconductor chips.

The at least one dummy chip may have a thermal expansion coefficient lower than that of the encapsulant.

The at least one dummy chip may not include connection pads.

The at least one dummy chip may not include wiring structures therein.

According to another aspect of the present disclosure, a fan-out semiconductor package may include a wiring portion, a semiconductor chip, a dummy die, and an encapsulant. The wiring portion includes an insulating layer and at least one conductive pattern. The semiconductor chip is disposed on an upper surface of the wiring portion and is electrically connected to the at least one conductive pattern of the wiring portion. The dummy die is disposed on the upper surface of the wiring portion. The encapsulant is disposed on the upper surface of the wiring portion and surrounds at least portions of the semiconductor chip and the dummy die. A thickness t of the dummy die is such that $T/2 \leq t \leq 3T/2$ where $T=(t1/2)-t2$ where t1 is a thickness of the fan-out semiconductor package and t2 is a thickness of the wiring portion.

The fan-out semiconductor package may include a plurality of semiconductor chips including the semiconductor chip, and the dummy die may be disposed between at least two semiconductor chips of the plurality of semiconductor chips on the upper surface of the wiring portion.

The fan-out semiconductor package may include a plurality of dummy dies including the dummy die, and each dummy die of the plurality of dummy dies may be disposed between at least two semiconductor chips of the plurality of semiconductor chips on the upper surface of the wiring portion.

The semiconductor chip may include one or more electronic component therein, and the dummy die may be free of any electronic component therein.

The semiconductor chip may include a plurality of wiring patterns therein, and the dummy die may be free of any wiring patterns therein.

The fan-out semiconductor package may include at least one bonding part disposed between a connection pad of the semiconductor chip and the upper surface of the wiring portion, and a space between the dummy die and the upper surface of the wiring portion may be free of any bonding part.

The at least one conductive pattern of the wiring portion may provide an electrical connection between a connection pad of the semiconductor chip and a conductive pattern exposed on a lower surface of the wiring portion opposite to the upper surface thereof.

The distance t2 may be a distance from the upper surface of the wiring portion to a lower surface of the wiring portion opposite to the upper surface thereof, and the distance t1 may be a distance from the lower surface of the wiring portion to an upper surface of the semiconductor chips facing away from the wiring portion.

The dummy die may be a dummy chip including a same semiconductor material as the semiconductor chip.

BRIEF DESCRIPTION OF DRAWINGS

The above and other aspects, features and other advantages of the present disclosure will be more clearly understood from the following detailed description taken in conjunction with the accompanying drawings, in which:

FIGS. 3A and 3B are schematic cross-sectional views illustrating a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
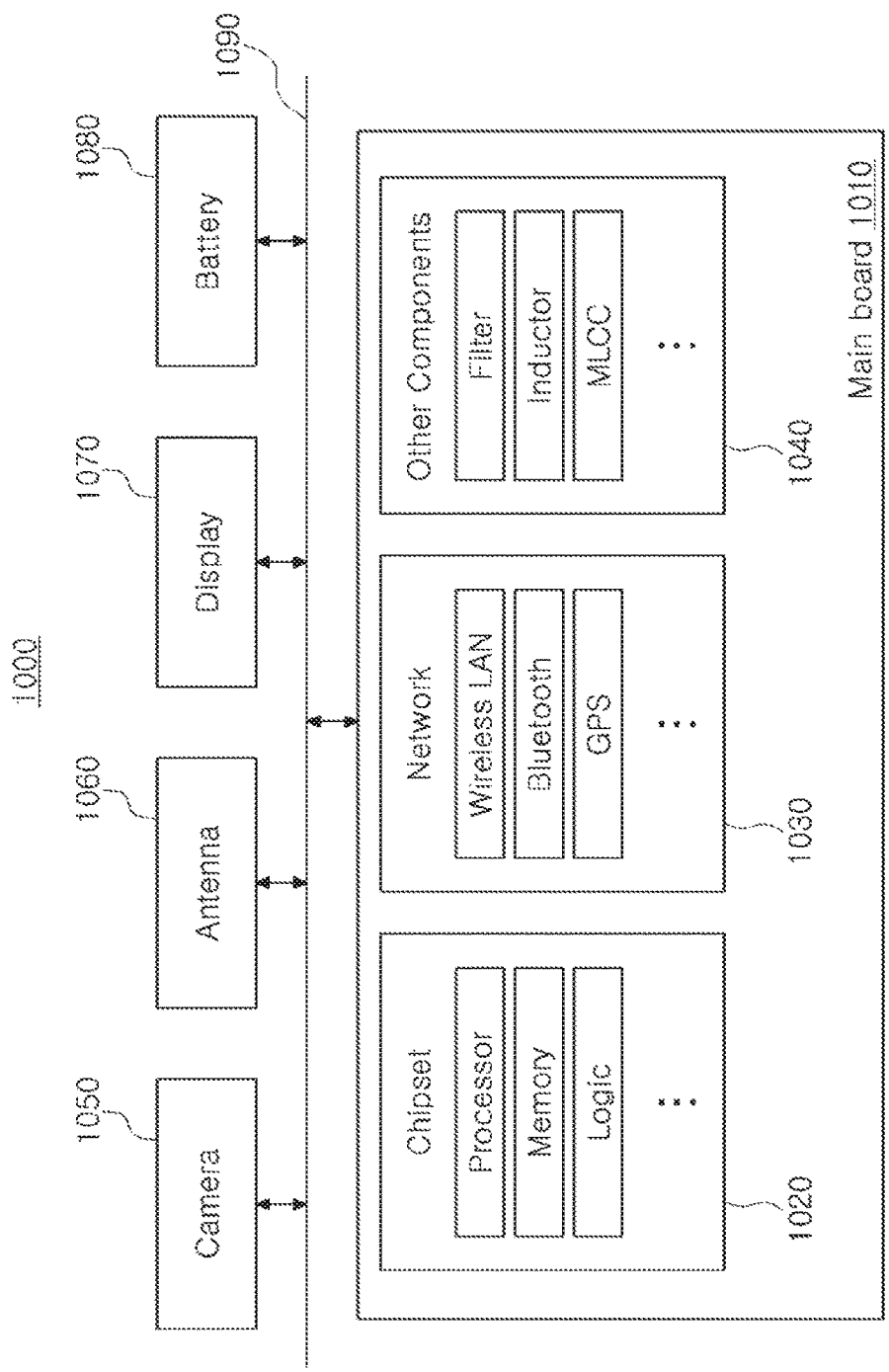
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below via various signal lines 1090.

The chip related components 1020 may include one or more of a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, and may also include other types of chip-related components. In addition, the chip related components 1020 may be combined with each other.

The network related components 1030 may include components configured to communicate using various protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include components configured to communicate using a variety of other wireless or wired standards or protocols. In addition, the network related components 1030 may be combined with each other, and/or together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, and/or together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive component, or the like. However, the electronic device 1000 is not limited thereto, and may be any other electronic device processing data.

Figure 2:
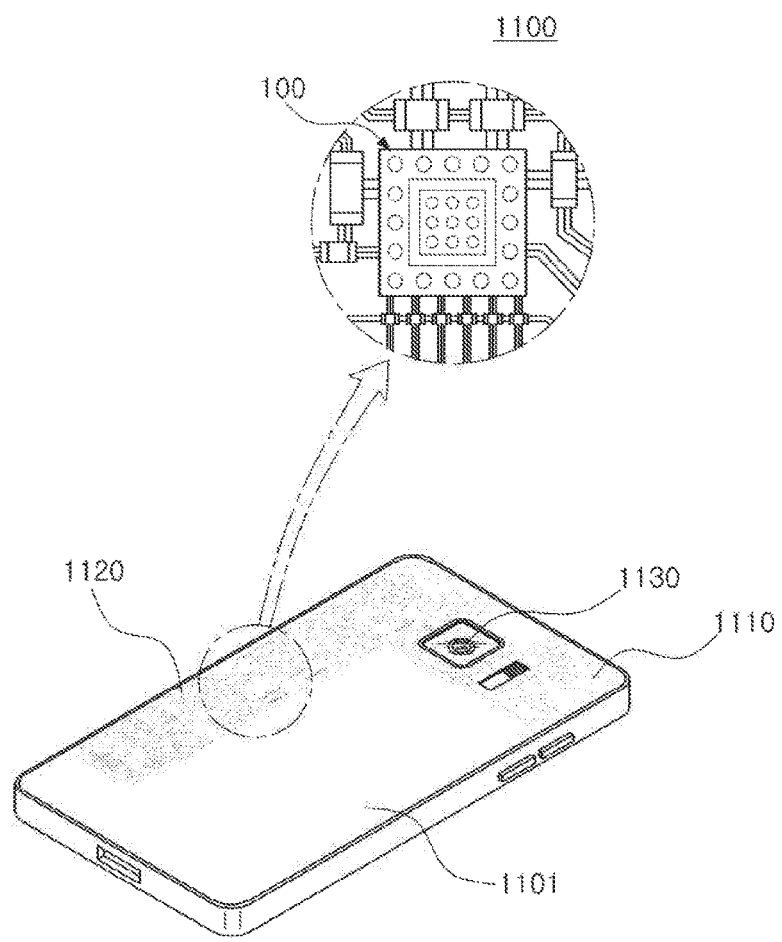
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various components 1120 may be physically or electrically connected to the motherboard 1110. In addition, other components that may or may not be physically or electrically connected to the mainboard 1010, such as a camera 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used alone, and may instead be packaged and used in an electronic device, or the like, in a packaged state.

Additionally, semiconductor packaging can be used to make adjustments related to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard can be significantly larger than those of the semiconductor chip. Therefore, it may be difficult to directly mount the semiconductor chip on the mainboard, and packaging technology for buffering a difference in a circuit width between the semiconductor chip and the mainboard may advantageously be used.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are schematic cross-sectional views illustrating a fan-in semiconductor package before and after being packaged.

Figure 4:
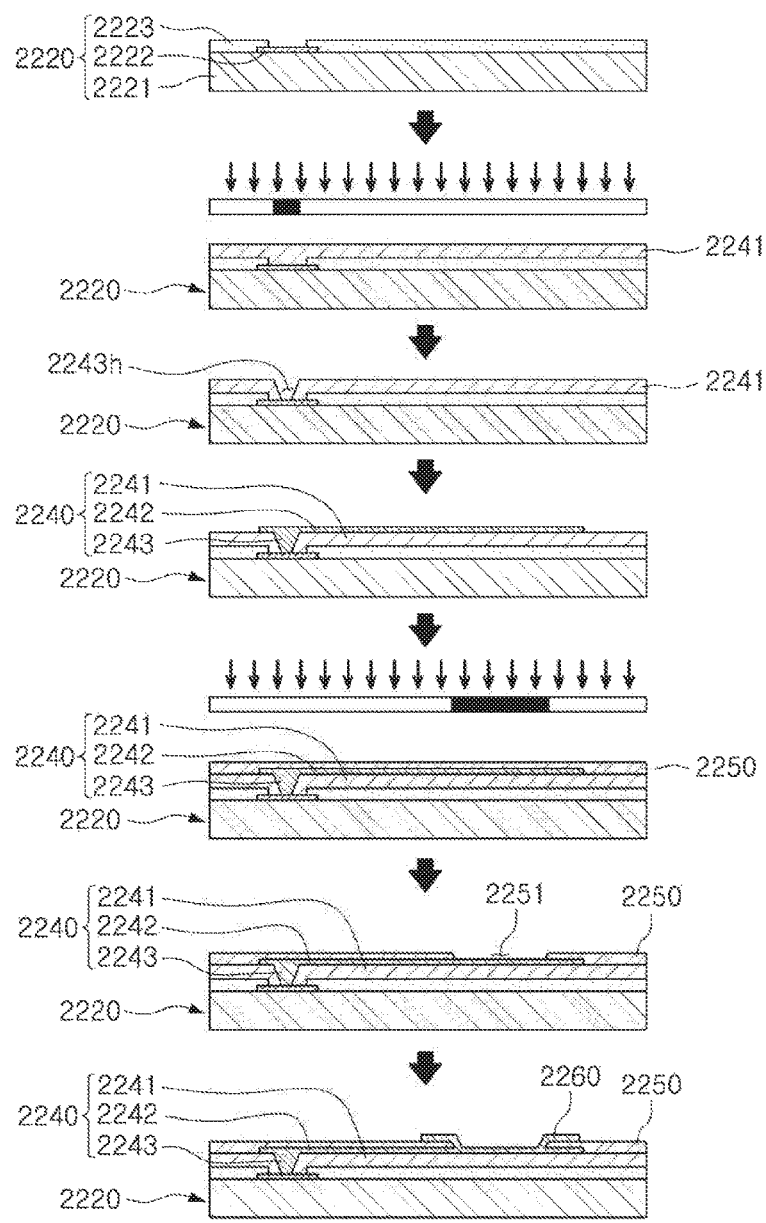
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243h aligned with and opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed in the opening 2251. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, corresponding for example to input/output (I/O) terminals, of the semiconductor chip are disposed inside an area of the semiconductor chip (or overlap with the semiconductor chip), and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals are disposed inside the semiconductor chip in the fan-in semiconductor package, the fan-in semiconductor package presents significant spatial limitations. Therefore, it is difficult to apply this structure to a semiconductor chip having a large number of I/O terminals or a semiconductor chip having a compact size. In addition, due to the disadvantage described above, the fan-in semiconductor package commonly may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
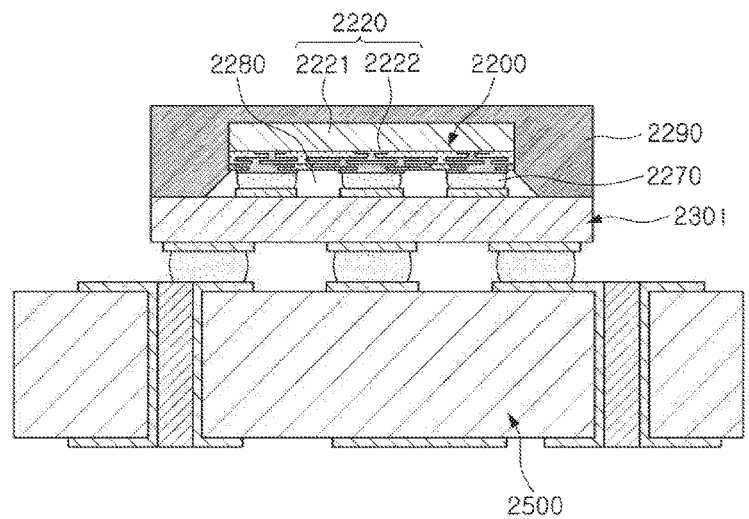
FIG. 5 is a schematic cross-sectional view illustrating a fan-in semiconductor package mounted on an interposer substrate and ultimately mounted on a mainboard of an electronic device.

FIG. 5 is a schematic cross-sectional view illustrating a fan-in semiconductor package that is mounted on an interposer substrate and is ultimately mounted on a mainboard of an electronic device.

Figure 6:
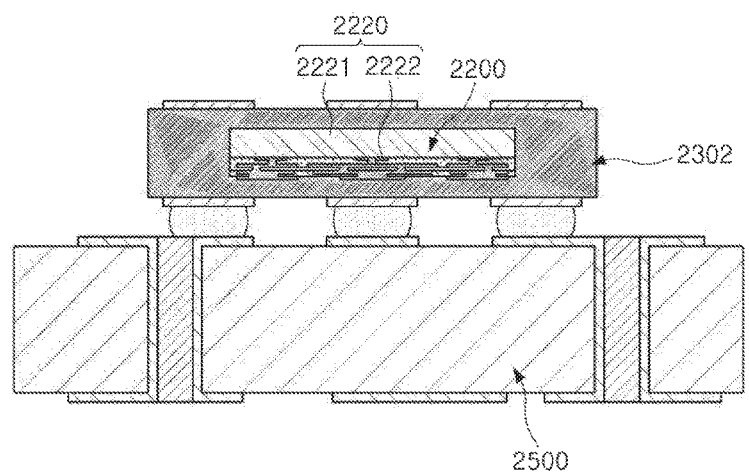
FIG. 6 is a schematic cross-sectional view illustrating a fan-in semiconductor package embedded in an interposer substrate and ultimately mounted on a mainboard of an electronic device.

FIG. 6 is a schematic cross-sectional view illustrating a fan-in semiconductor package that is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
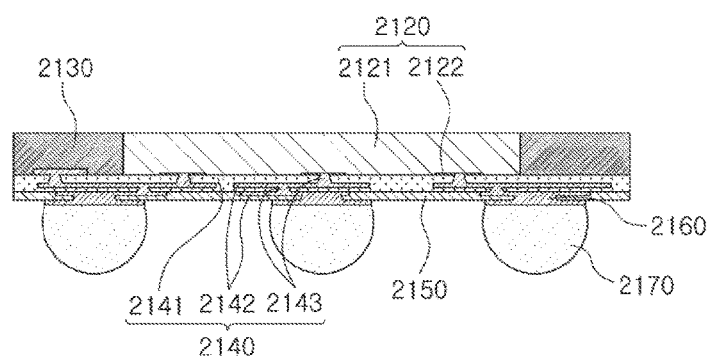
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip (e.g., outwardly of an area of overlap with the semiconductor chip) through the connection member formed on the semiconductor chip. As described above, in the fan-in semiconductor package, all I/O terminals of the semiconductor chip are disposed inside an area of overlap with the semiconductor chip. Therefore, when a size of the semiconductor chip is decreased, a size and a pitch of balls may need to be decreased, such that a standardized ball layout may not be used in the fan-in semiconductor package. On the other hand, the fan-out semiconductor package has the form in which the I/O terminals of the semiconductor chip are redistributed and disposed outwardly of an area of overlap with the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
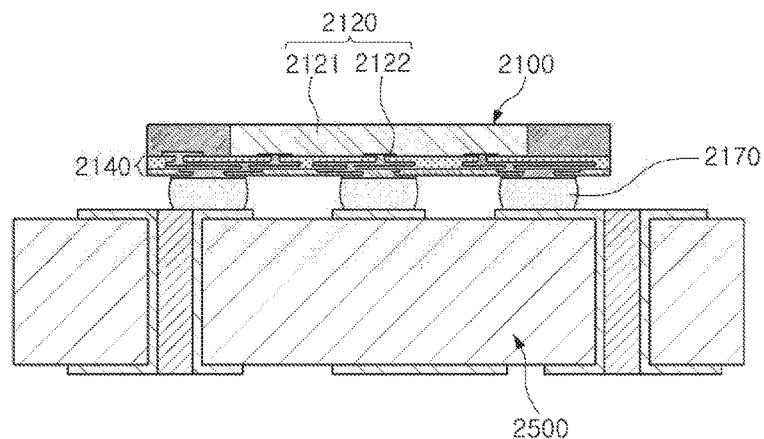
FIG. 8 is a schematic cross-sectional view illustrating a fan-out semiconductor package mounted on a mainboard of an electronic device.

FIG. 8 is a schematic cross-sectional view illustrating a fan-out semiconductor package mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package containing a dummy chip capable of effectively reducing warpage that may occur due to a difference in thermal expansion characteristics of an upper portion and a lower portion based on a center line of a semiconductor package will hereinafter be described with reference to the drawings.

Figure 9:
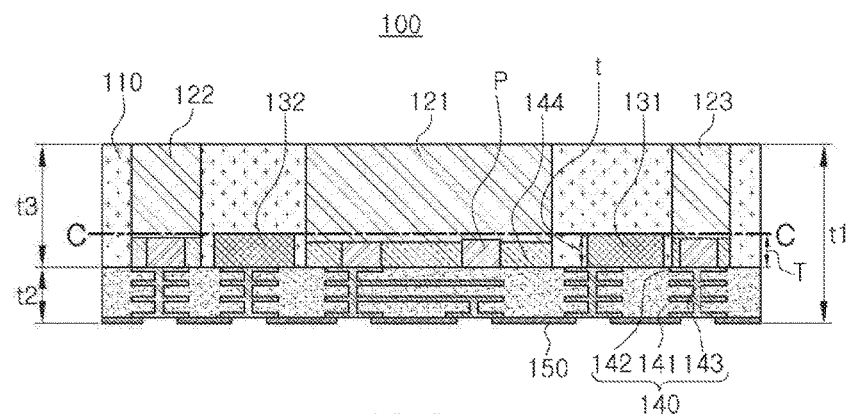
FIG. 9 is a schematic cross-sectional view illustrating an example of a fan-out semiconductor package.
Figure 10:
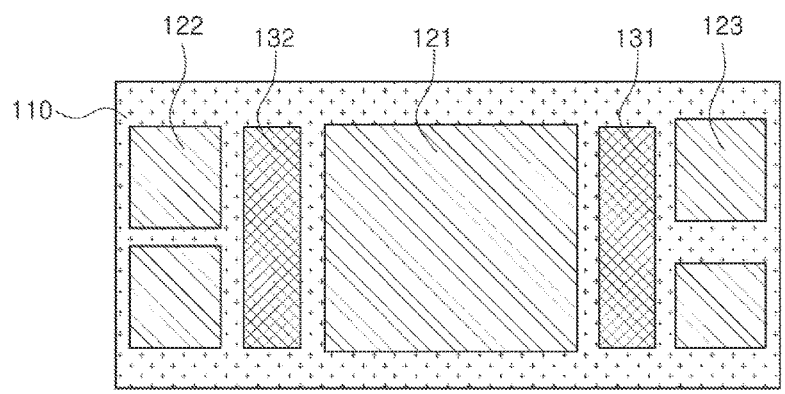
FIGS. 10 and 11 are top views of the fan-out semiconductor package of FIG. 9.
Figure 11:
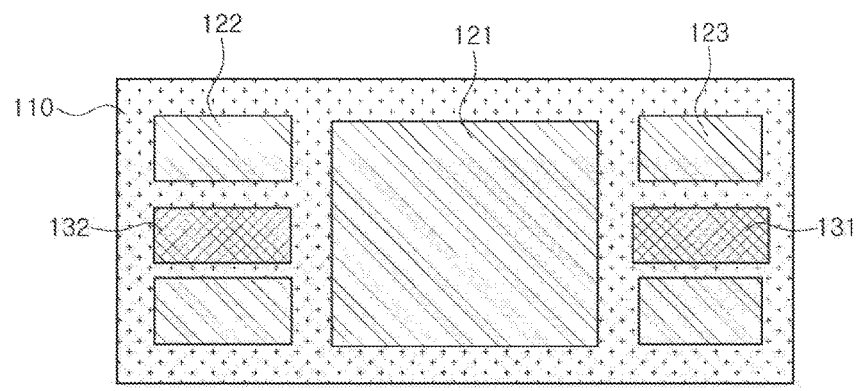

FIG. 9 is a schematic cross-sectional view illustrating an example of a fan-out semiconductor package. FIGS. 10 and 11 are top views of the fan-out semiconductor package of FIG. 9.

Referring to FIGS. 9 and 10, a fan-out semiconductor package 100 according to an exemplary embodiment may include a wiring portion 140, semiconductor chips 121, 122, and 123 disposed on one region on the wiring portion 140, dummy chips 131 and 132 disposed on the other region on the wiring portion 140, and an encapsulant 110 disposed on the wiring portion 140 and encapsulating at least portions of the semiconductor chips 121, 122, and 123 and the dummy chips 131 and 132. For example, the encapsulant 110 may encapsulate at least a portion of each of the semiconductor chips 121, 122, and 123 and the dummy chips 131 and 132. Here, the dummy chips 131 and 132 may be thinner than the semiconductor chips 121, 122, and 123, and thicknesses t of the dummy chips 131 and 132 may affect warpage characteristics of the fan-out semiconductor package 100. The dummy chips 131 and 132 may also be dummy dies, such as bare dies. Details related to this will be described in more detail below. In addition to the components described above, the fan-out semiconductor package 100 may include a passivation layer 150 covering at least a portion of the wiring portion 140 as illustrated in FIG. 9, and the passivation layer 150 may be regarded as configuring a portion of the wiring portion 140.

The respective components included in the fan-out semiconductor package 100 according to the exemplary embodiment will hereinafter be described in more detail.

The semiconductor chips 121, 122, and 123 may have active surfaces on which connection pads P are disposed, and inactive surfaces disposed opposite to the active surfaces. Although the present exemplary embodiment describes the fan-out semiconductor package 100 including three semiconductor chips 121, 122, and 123, the number of the semiconductor chips 121, 122, and 123 may be changed if necessary. The semiconductor chips 121, 122, and 123 may be integrated circuits (ICs) each providing several hundred to several million or more elements integrated in a single chip. In this case, each IC may be, for example, a processor chip (more specifically, an application processor (AP)) such as a central processor (for example, a CPU), a graphics processor (for example, a GPU), a field programmable gate array (FPGA), a digital signal processor, a cryptographic processor, a microprocessor, a microcontroller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the above-mentioned elements may also be combined with each other and provided in an IC.

The semiconductor chips 121, 122, and 123 may be formed on the basis of an active wafer. In this case, a base material of each of bodies of the semiconductor chips 121, 122, and 123 may be silicon (Si), germanium (Ge), gallium arsenide (GaAs), or the like. In addition, various circuits may be formed on the body. The connection pads P may electrically connect the semiconductor chips 121, 122, and 123 to other components. A material of each of the connection pads P may be a conductive material such as aluminum (Al), or the like. In addition, a bonding part 144 formed of an insulating adhesive layer, or the like may be interposed between the semiconductor chips 121, 122, and 123 and the wiring portion 140 to stably mount the semiconductor chips 121, 122, and 123. However, such a bonding part 144 may be appropriately modified or omitted according to an exemplary embodiment. The bonding part 144 may be a solder resist formed to expose the connection pads P of the semiconductor chips 121, 122, and 123. Meanwhile, the semiconductor chips 121, 122, and 123 may be a bare die, a redistribution layer (not illustrated) may further be formed on the active surfaces of the semiconductor chips 121, 122, and 123, if necessary, and bumps (not illustrated), or the like, may be connected to the connection pads P.

The encapsulant 110 may protect the semiconductor chips 121, 122, and 123, the dummy chips 131 and 132, the wiring portion 140, and the like. An encapsulation form of the encapsulant 110 is not particularly limited, and may be a form in which the encapsulant 110 surrounds at least portions of the semiconductor chips 121, 122, and 123 and the wiring portion 140. According to the present exemplary embodiment, one surface of each of the semiconductor chips 121, 122, and 123 may be exposed from the encapsulant 110. Accordingly, heat generated in the semiconductor chips 121, 122, and 123, or the like may be effectively discharged. In more detail, the inactive surfaces (corresponding to the top surface in FIG. 9) of the semiconductor chips 121, 122, and 123 may be exposed from the encapsulant 110, as illustrated in FIG. 9. Although the present exemplary embodiment illustrates the form in which one surface of each of all of the semiconductor chips 121, 122, and 123 is exposed, only a portion of one surface of each of the semiconductor chips 121, 122, and 123 may alternatively be exposed.

A material of the encapsulant 110 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a photo imagable encapsulant (PIE) resin may also be used as the insulating material.

The wiring portion 140 may redistribute the connection pads P of the semiconductor chips 121, 122, and 123. Several tens to several hundreds of connection pads P of the semiconductor chips 121, 122, and 123 having various functions may be redistributed by the wiring portion 140, and may be physically or electrically externally connected through the electrical connection structures depending on the functions. The wiring portion 140 may include the insulating layers 141, the conductive patterns 142, and the conductive vias 143.

An insulating material of each of the insulating layers 141 may be one of various kinds of materials, for example, a photosensitive resin. In a case in which the insulating layers 141 have photosensitivity, the insulating layers 141 may be formed to be thinner. Further, the conductive vias 143 may be implemented in finer pitch. In order to adjust rigidity or other properties, the insulating layers 141 may include an inorganic filler. When the insulating layers 141 are provided as multiple layers, materials of the different insulating layers 141 may be the same as each other, and may also be different from each other, if desired. In addition, when the insulating layers 141 are provided as multiple layers, the insulating layers 141 may be integrated with each other depending on a process, such that a boundary therebetween may also not be apparent.

The conductive patterns 142 may serve to substantially redistribute and/or interconnect the connection pads P. A material of each of the conductive patterns 142 may be a conductive material such as copper (Cu), aluminum (Al), silver (Ag), tin (Sn), gold (Au), nickel (Ni), lead (Pb), titanium (Ti), or alloys thereof. The conductive patterns 142 may perform various functions depending on a design of the corresponding layers. For example, the conductive patterns 142 may include ground (GND) patterns, power (PWR) patterns, signal (S) patterns, and the like. Here, the signal (S) patterns may include various signals with the exception of the ground (GND) patterns, the power (PWR) patterns, and the like, such as data signals, and the like. In addition, the conductive patterns 142 may include via pad patterns, electrical connection structure pad patterns, and the like. A thickness of each of the conductive patterns 142 may be about 0.5 μm to 15 μm.

The conductive vias 143 may electrically connect the conductive patterns 142, the connection pads P, and the like, formed on different layers to each other, thereby forming an electrical path within the fan-out semiconductor package 100. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have any shape known in the related art, such as a tapered shape, a cylindrical shape, and the like.

The passivation layer 150 may protect the wiring portion 140 from external physical or chemical damage. The passivation layer 150 may have openings exposing at least portions of the conductive patterns 142 of the wiring portion 140. The number of openings formed in the passivation layer 150 may be several tens to several thousands. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a solder resist may also be used.

Meanwhile, although not illustrated, electrical connection structures such as solders, or the like, may be formed on a lower portion of the fan-out semiconductor package 100 and may be connected to the conductive patterns 142. The fan-out semiconductor package 100 may be mounted on a mainboard of the electronic device by such electrical connection structures.

According to the present exemplary embodiment, the dummy chips 131 and 132 may be used. Further, room temperature warpage may be reduced by adjusting the thicknesses of the dummy chips 131 and 132. In a form in which the encapsulant 110 covers upper portions of the semiconductor chips 121, 122, and 123, warpage may be adjusted by adjusting a thickness of the encapsulant 110. However, in a structure in which the top surfaces of the semiconductor chips 121, 122, and 123 are exposed as in the present exemplary embodiment, warpage may occur due to different thermal expansion characteristics of an upper portion and a lower portion of the fan-out semiconductor package based on a center line C of the fan-out semiconductor package. In the case of the lower portion of the fan-out semiconductor package 100, since a ratio of a material having a high thermal expansion coefficient such as the conductive patterns 142, or the like is greater than that of the upper portion of the fan-out semiconductor package 100, the thermal expansion coefficient of the lower portion of the fan-out semiconductor package 100 may be greater than that of the upper portion thereof, and warpage may occur in a process of manufacturing the fan-out semiconductor package 100 or when a temperature is changed. For example, when the temperature is changed from a high temperature to a room temperature, an amount of shrinkage of the lower portion of the fan-out semiconductor package 100 may be increased such that a warpage of an upwardly convex form may occur. Here, the center line C of the fan-out semiconductor package is a line corresponding to a half (t1/2) of a total thickness t1 of the fan-out semiconductor package 100 in relation to the cross-sectional view of FIG. 9. In addition, t2 is a thickness of the wiring portion 140, and t3 is a thickness of the encapsulant 110.

The use of separate dummy chips 131 and 132 in addition to the semiconductor chips 121, 122, and 123 in the present exemplary embodiment is to reduce a thermal expansion coefficient in a lower region of the fan-out semiconductor package 100 as a whole by replacing some of a region of the encapsulant 110 with the dummy chips 131 and 132 having the thermal expansion coefficient lower than that of the encapsulant 110 As a result, a difference in the thermal expansion coefficients of the upper portion and the lower portion of the fan-out semiconductor package 100 may be reduced, thereby improving warpage characteristics. To this end, the dummy chips 131 and 132 may include the same semiconductor material as the semiconductor chips 121, 122, and 123, and a plurality of dummy chips may be provided if necessary. In this case, the plurality of dummy chips 131 and 132 may be disposed in corresponding regions between the plurality of semiconductor chips 121, 122, and 123 as illustrated in FIGS. 10 and 11. Although the present exemplary embodiment illustrates a structure in which two dummy chips 131 and 132 are used, one dummy chip or three or more dummy chips may also be used.

In order to reduce the thermal expansion coefficient of the lower portion of the fan-out semiconductor package 100, the thicknesses of the dummy chips 131 and 132 may be adjusted around a center line C of the fan-out semiconductor package. The center line C of the fan-out semiconductor package may correspond to a plane parallel to a mounting surface of the fan-out semiconductor package 100 (e.g., parallel to a surface of the fan-out semiconductor package having the externally exposed conductive patterns 142 thereon), and disposed substantially in a center of a thickness of the fan-out semiconductor package 100 measured orthogonally to the mounting surface. The inventors have found that when an upper surface of the wiring portion 140 is disposed below the center line C of the fan-out semiconductor package, warpage is effectively reduced in the case of $T/2 \leq t \leq 3T/2$ in which t is the thicknesses of the dummy chips 131 and 132, and T is a distance from the upper surface of the wiring portion 140 to the center line C of the fan-out semiconductor package. Referring to FIG. 9, T may be defined as a value obtained by subtracting a thickness t2 of the wiring portion 140 from a half of the thickness t1 of the fan-out semiconductor package 100.

Figure 12:
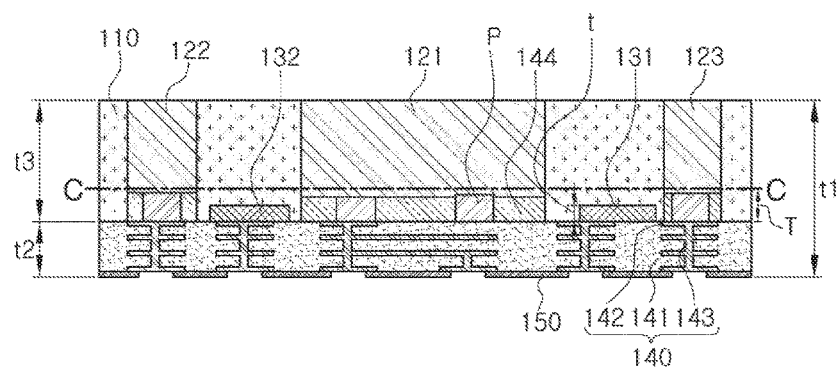
FIGS. 12 and 13 are schematic cross-sectional views illustrating a fan-out semiconductor package according to an example modified from a structure of FIG. 11.
Figure 13:
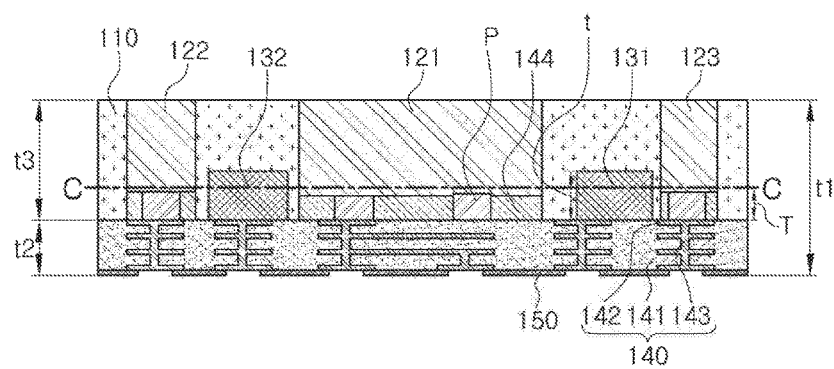
Figure 14:
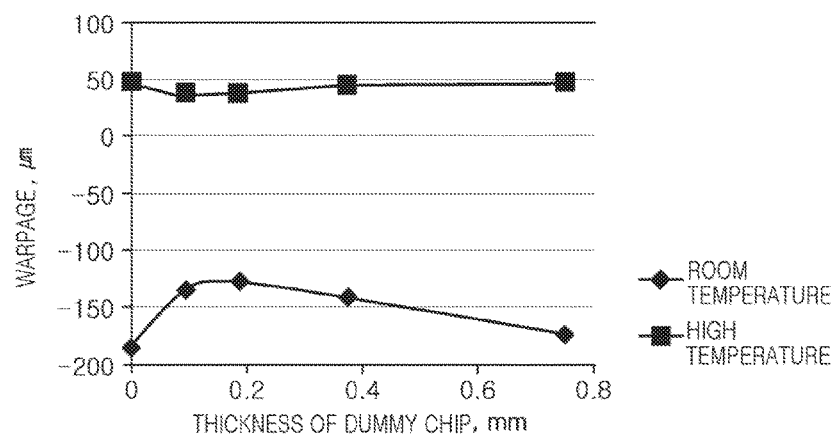
FIG. 14 is a graph illustrating warpage characteristics as a function of a thickness of a dummy chip.

As illustrated in FIG. 9, when the thicknesses t of the dummy chips 131 and 132 are the same as T, that is, the center line C of the fan-out semiconductor package is positioned on the upper surfaces of the dummy chips 131 and 132, warpage may be most effectively reduced. The modified examples of FIGS. 12 and 13 illustrate forms in which the thicknesses t of the dummy chips 131 and 132 are T/2 and 3T/2, respectively. In a case in which the thicknesses of the dummy chips 131 and 132 are thinner than T/2, a warpage reduction effect may not be sufficiently obtained, and even in a case in which the thicknesses of the dummy chips 131 and 132 are thicker than 3T/2, the thermal expansion coefficient of the upper portion of the fan-out semiconductor package 100 is excessively reduced, such that the warpage reduction effect may not be obtained. FIG. 14 is a graph illustrating how warpage characteristics are changed depending on a thickness of a dummy chip. A negative value (−) corresponds to an upwardly convex warpage and a positive value (+) corresponds to a downwardly convex warpage. From the result of FIG. 14, it may be seen that the room temperature warpage is low when the thicknesses of the dummy chips are about 0.1 to 0.3 mm, and since T (the distance from the upper surface of the wiring portion to the center line of the fan-out semiconductor package) is about 0.2 mm in the fan-out semiconductor package used in the test, it may be seen that warpage characteristics are excellent in $T/2 \le t \le 3T/2$ as in the above-mentioned result.

Meanwhile, the dummy chips 131 and 132 do not need to perform a function of the semiconductor chips 121, 122, and 123, and may not be electrically connected to the wiring portion 140. Therefore, as illustrated in FIG. 9, the dummy chips 131 and 132 may not include connection pads. In addition, the dummy chips 131 and 132 may not include wiring structures therein. However, the dummy chips 131 and 132 are not necessarily limited thereto, and may also include the connection pads, the wiring structures, or the like as long as they may sufficiently perform a warpage reduction function.

An example of a method for manufacturing a fan-out semiconductor package having the above-mentioned structure will be described hereinafter, and structural characteristics of the fan-out semiconductor package may be more clearly understood from a description of a manufacturing process. FIGS. 15 through 19 are cross-sectional views schematically illustrating a process of manufacturing a fan-out semiconductor package according to an exemplary embodiment in the present disclosure.

Figure 15:
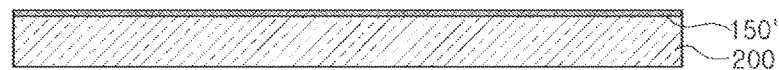
FIGS. 15 through 19 are cross-sectional views schematically illustrating a process of manufacturing a fan-out semiconductor package according to an exemplary embodiment in the present disclosure.

First, as illustrated in FIG. 15, a passivation layer 150' may be formed on a carrier 200. The carrier 200 may handle a wiring portion 140 having a relatively thin thickness, and a material of the carrier 200 is not particularly limited as long as the carrier 200 serves as a support. The carrier 200 may have a multilayer structure, and may include a release layer, a metal layer, and the like, so as to be easily removed from the wiring portion 140 in a subsequent process. For example, the carrier 200 may be a copper clad laminate (CCL). The passivation layer 150' may be formed of a material such as an epoxy, a polyimide resin, or the like, using an application process known in the related art.

Figure 16:
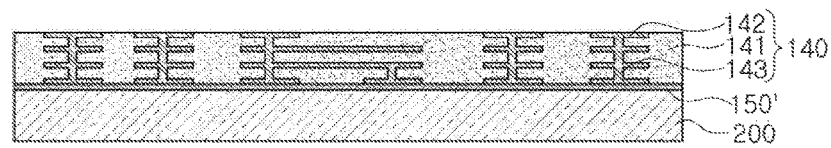

Next, as illustrated in FIG. 16, a wiring portion 140 may be formed on the carrier 200. In order to implement the wiring portion 140, the insulating layer 141, the conductive patterns 142, and the conductive vias 143 may be formed, depending on intended shapes. Processes of forming the insulating layer 141, the conductive patterns 142, and the conductive vias 143 may be repeated a number of times to form a multi-layer wiring portion. In this case, the plating layer may further be formed on the conductive patterns 142 at the uppermost portion. The insulating layer 141 may be formed by, for example, a method of laminating the insulating layer 141 and then hardening the insulating layer 141, a method of applying a material for forming the insulating layer 141 and then hardening the material, or the like. As the method of laminating the insulating layer, for example, a method of performing a hot press process of pressing the insulating layer for a predetermined time at a high temperature, decompressing the insulating layer, and then cooling the insulating layer to room temperature, cooling the insulating layer in a cold press process, and then separating a work tool, or the like, may be used. As a method of applying a material, for example, a screen printing method of applying ink with a squeegee, a spray printing method of applying ink in a mist form, or the like, may be used. The hardening process, which is a post-process, may be a process of drying the material so as not to be completely hardened in order to use a photolithography method, or the like.

An electrical test for determining whether or not the wiring portion 140 is bad may be performed before mounting the semiconductor chips. In detail, it is determined whether the wiring portion 140 is bad in terms of an electrical connection, and as one example of such method, a test jig may be connected to the conductive patterns 142 on the wiring portion 140. Whether or not the wiring portion 140 is bad may be determined in advance by such an electrical test, thereby significantly reducing unnecessary consumption of the electronic components. That is, the wiring portion 140 determined to be bad in the present test process may be discarded or reused for another purpose, and a subsequent process is not performed on the wiring portion 140 determined to be bad, such that a process cost may be reduced. Such a wiring portion 140 may include an additional structure for electrical testing, such as a daisy chain, and accordingly, the electrical test may be performed through an upper portion of the wiring portion 140 even in a state in which the carrier 200 is bonded to the lower portion of the wiring portion 140.

Figure 17:
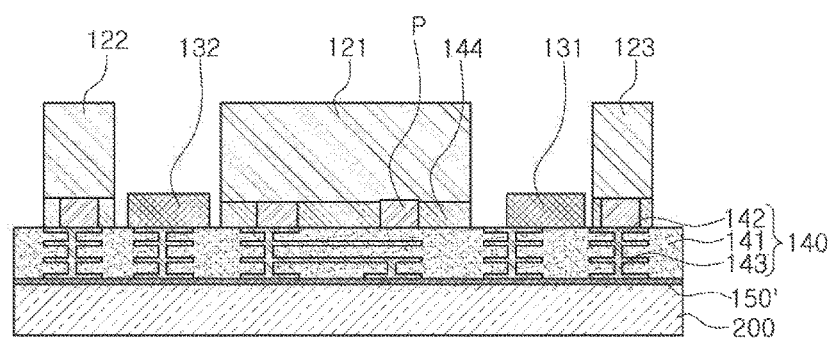

Next, as illustrated in FIG. 17, the semiconductor chips 121, 122, and 123, may be disposed and mounted on the wiring portion 140, and in this case, the semiconductor chips 121, 122, and 123 may be disposed so that the electrode pads P are directed to the wiring portion 140. In order to stably mount the semiconductor chips 121, 122, and 123, a bonding part 144, or the like may be formed on the wiring portion 140 before mounting the semiconductor chips 121, 122, and 123 on the wiring portion 140. In addition, in order to reduce warpage as described, the dummy chips 131 and 132 having the adjusted thicknesses may be disposed on the wiring portion 140.

Figure 18:
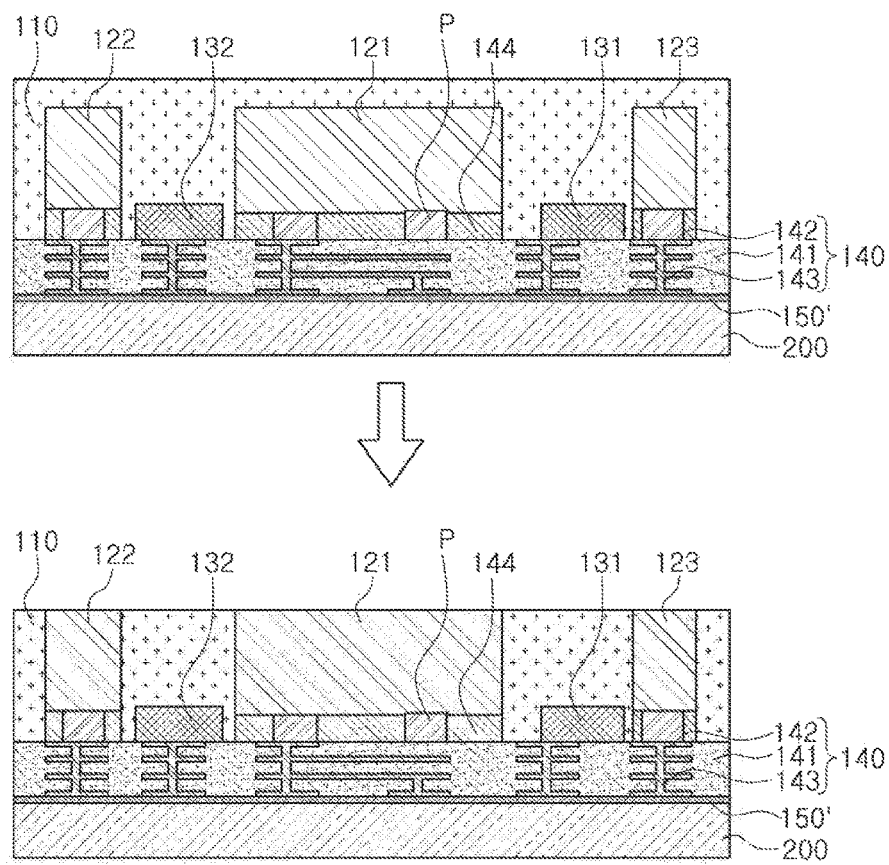

Next, as illustrated in FIG. 18, an encapsulant 110 covering the semiconductor chips 121, 122, and 123 and the dummy chips 131 and 132 may be formed. A method for forming an encapsulant 110 may be a method for stacking a resin film such as ABF, or the like in an unhardened state on the wiring portion 140 and then hardening the resin film. In this case, the encapsulant 110 may be over-molded to cover upper surfaces of the semiconductor chips 121, 122, and 123 and may be then removed by an appropriate polishing process. As a result, the upper surfaces of the semiconductor chips 121, 122, and 123 may be exposed. In addition, the upper surfaces of the semiconductor chips 121, 122, and 123 may be partially removed in such a polishing process.

Figure 19:
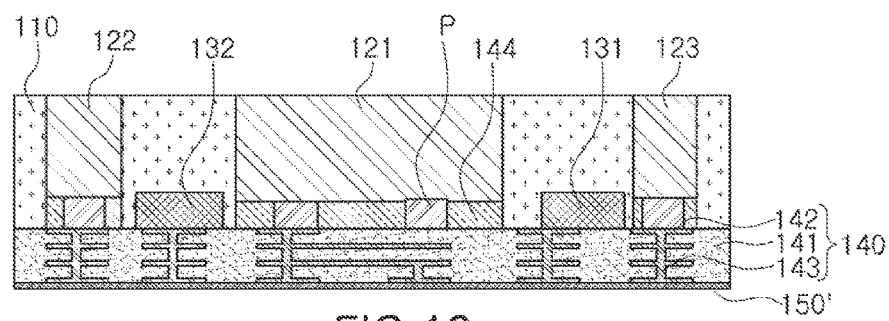

Next, the carrier 200 may be removed from the wiring portion 140, and FIG. 19 illustrates a state after the carrier 200 is removed from the wiring portion 140. Materials remaining after removing the carrier 200 may be removed by appropriately using an etching and desmear process used in the related art. When the carrier 200 is removed, warpage may occur due to a difference in thermal expansion coefficients of the upper and lower portions of the fan-out semiconductor package. However, the occurrence of warpage may be reduced by the use of the dummy chips 131 and 132 as described above. Next, the conductive patterns 142 may be exposed by removing a portion of the passivation layer 150'. As a result, the fan-out semiconductor package as illustrated in FIG. 9 may be implemented.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite side/portion/surface/direction to the lower side/portion/surface/direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part with one another. For example, one element described in a particular exemplary embodiment, even if it is not described in another exemplary embodiment, may be understood as a description related to the other exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiment in the present disclosure, a fan-out semiconductor package may be provided in which the heat radiation characteristics are excellent and the room temperature warpage is effectively controlled.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
   a wiring portion including an insulating layer, conductive patterns formed on the insulating layer, and conductive vias penetrating through the insulating layer and connected to the conductive patterns;
   semiconductor chips disposed on one region of the wiring portion;
   at least one dummy chip disposed on another region of the wiring portion and having a thickness smaller than those of the semiconductor chips; and
   an encapsulant disposed on the wiring portion and encapsulating at least portions of the semiconductor chips and the at least one dummy chip,
   wherein an upper surface of the wiring portion is disposed below a center line of the fan-out semiconductor package, and
   the thickness t of the at least one dummy chip is such that $T/2 \leq t \leq 3T/2$ in which T is a distance from the upper surface of the wiring portion to the center line of the fan-out semiconductor package.

2. The fan-out semiconductor package of claim 1, wherein one surface of each of the semiconductor chips is exposed from the encapsulant.

3. The fan-out semiconductor package of claim 2, wherein
   the semiconductor chips each include an active surface on which connection pads are disposed and an inactive surface opposite to the active surface,
   the inactive surfaces are exposed from the encapsulant, and
   a space between each dummy chip of the at least one dummy chip and the wiring portion is free of the encapsulant and free of any semiconductor chip.

4. The fan-out semiconductor package of claim 2, wherein a plurality of semiconductor chips are provided, and
   one surface of each of the plurality of semiconductor chips is exposed from the encapsulant.

5. The fan-out semiconductor package of claim 4, wherein each of the at least one dummy chip is disposed between semiconductor chips of the plurality of semiconductor chips.

6. The fan-out semiconductor package of claim 1, wherein a plurality of dummy chips are provided.

7. The fan-out semiconductor package of claim 6, wherein the thickness of each of the plurality of dummy chips is the same as T.

8. The fan-out semiconductor package of claim 1, wherein the at least one dummy chip includes the same semiconductor material as the semiconductor chips.

9. The fan-out semiconductor package of claim 1, wherein the at least one dummy chip has a thermal expansion coefficient lower than that of the encapsulant.

10. The fan-out semiconductor package of claim 1, wherein the at least one dummy chip does not include connection pads.

11. The fan-out semiconductor package of claim 1, wherein the at least one dummy chip does not include wiring structures therein.

12. A fan-out semiconductor package comprising:
    a wiring portion including an insulating layer and at least one conductive pattern;
    a semiconductor chip disposed on an upper surface of the wiring portion and electrically connected to the at least one conductive pattern of the wiring portion;
    a dummy die disposed on the upper surface of the wiring portion; and
    an encapsulant disposed on the upper surface of the wiring portion and surrounding at least portions of the semiconductor chip and the dummy die,
    wherein a thickness t of the dummy die is such that $T/2 \leq t \leq 3T/2$ where $T=(t1/2)-t2$ where t1 is a thickness of the fan-out semiconductor package and t2 is a thickness of the wiring portion.

13. The fan-out semiconductor package of claim 12, further comprising a plurality of semiconductor chips including the semiconductor chip,
    wherein the dummy die is disposed between at least two semiconductor chips of the plurality of semiconductor chips on the upper surface of the wiring portion.

14. The fan-out semiconductor package of claim 13, further comprising a plurality of dummy dies including the dummy die,
    wherein each dummy die of the plurality of dummy dies is disposed between at least two semiconductor chips of the plurality of semiconductor chips on the upper surface of the wiring portion.

15. The fan-out semiconductor package of claim 12, wherein the semiconductor chip includes one or more electronic component therein, and the dummy die is free of any electronic component therein.

16. The fan-out semiconductor package of claim 12, wherein the semiconductor chip includes a plurality of wiring patterns therein, and the dummy die is free of any wiring patterns therein, and a space between the dummy die and the wiring portion is free of the encapsulant and free of any semiconductor chip.

17. The fan-out semiconductor package of claim 12, further comprising at least one bonding part disposed between a connection pad of the semiconductor chip and the upper surface of the wiring portion, wherein a space between the dummy die and the upper surface of the wiring portion is free of any bonding part.

18. The fan-out semiconductor package of claim 12, wherein the at least one conductive pattern of the wiring portion provides an electrical connection between a connection pad of the semiconductor chip and a conductive pattern exposed on a lower surface of the wiring portion opposite to the upper surface thereof.

19. The fan-out semiconductor package of claim 12, wherein t2 is a distance from the upper surface of the wiring portion to a lower surface of the wiring portion opposite to the upper surface thereof, and t1 is a distance from the lower surface of the wiring portion to an upper surface of the semiconductor chips facing away from the wiring portion.

20. The fan-out semiconductor package of claim 12, wherein the dummy die is a dummy chip including a same semiconductor material as the semiconductor chip.

\* \* \* \* \*